United States Patent
Chen

(10) Patent No.: US 6,238,181 B1
(45) Date of Patent: May 29, 2001

(54) HEAT DISSIPATING DEVICE FOR PORTABLE APPARATUS

(76) Inventor: Andy Chen, 6F, No. 440-2, Gin Pin Road, Chong Ho City, Taipei Hsien 235 (TW)

(*) Notice: Subject to any disclaimer, the term of this patent is extended or adjusted under 35 U.S.C. 154(b) by 0 days.

(21) Appl. No.: 09/416,106

(22) Filed: Oct. 5, 1999

(51) Int. Cl.[7] .................................................. F03B 11/00
(52) U.S. Cl. ......................... 415/175; 415/178; 415/220
(58) Field of Search ................................... 415/175, 176, 415/177, 178, 220, 221; 361/695, 697, 690

(56) References Cited

U.S. PATENT DOCUMENTS

| | | | |
|---|---|---|---|
| 4,568,243 | * | 2/1986 | Schubert et al. ................. 415/213 |
| 4,702,154 | * | 10/1987 | Dodson ................................. 98/1 |
| 5,440,450 | * | 8/1995 | Lau et al. .......................... 361/695 |
| 6,034,870 | * | 3/2000 | Osborn et al. ..................... 361/690 |
| 6,049,455 | * | 4/2000 | Nakamura et al. ................. 361/688 |
| 6,111,748 | * | 8/2000 | Bhatia ............................... 361/695 |

* cited by examiner

Primary Examiner—F. Daniel Lopez
Assistant Examiner—Ninh Nguyen

(57) ABSTRACT

A portable apparatus includes a housing having an inclined board for formed a cut-off opening and having one or more apertures formed in the inclined board and communicating with the cut-off opening of the housing for preventing the aperture of the inclined board from being blocked and for allowing the air to be drawn into the housing with a fan device which is secured to the inclined board. A stand is secured to the housing and is engaged with the flexible sheet members disposed below the housing for positioning and for preventing the flexible sheet members from blocking the apertures.

4 Claims, 4 Drawing Sheets

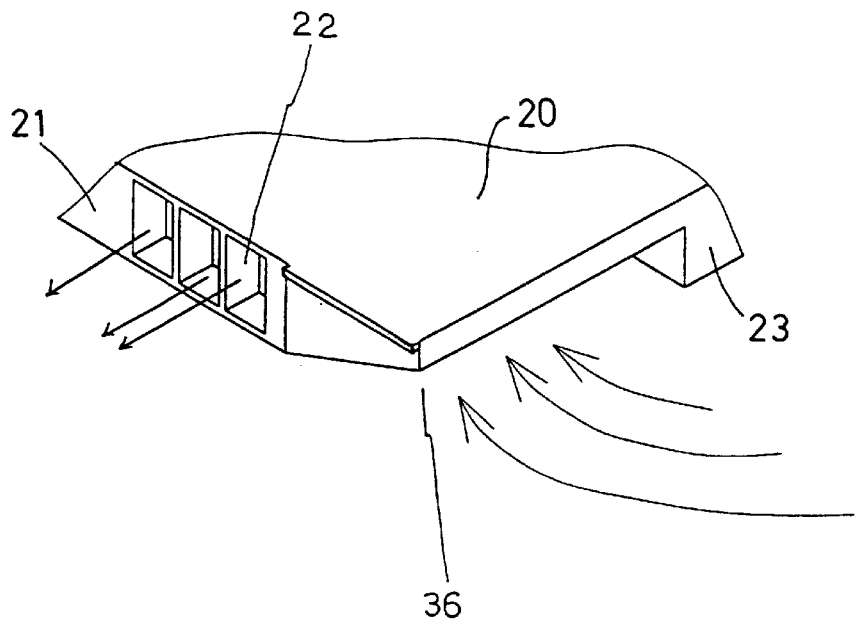
FIG. 3
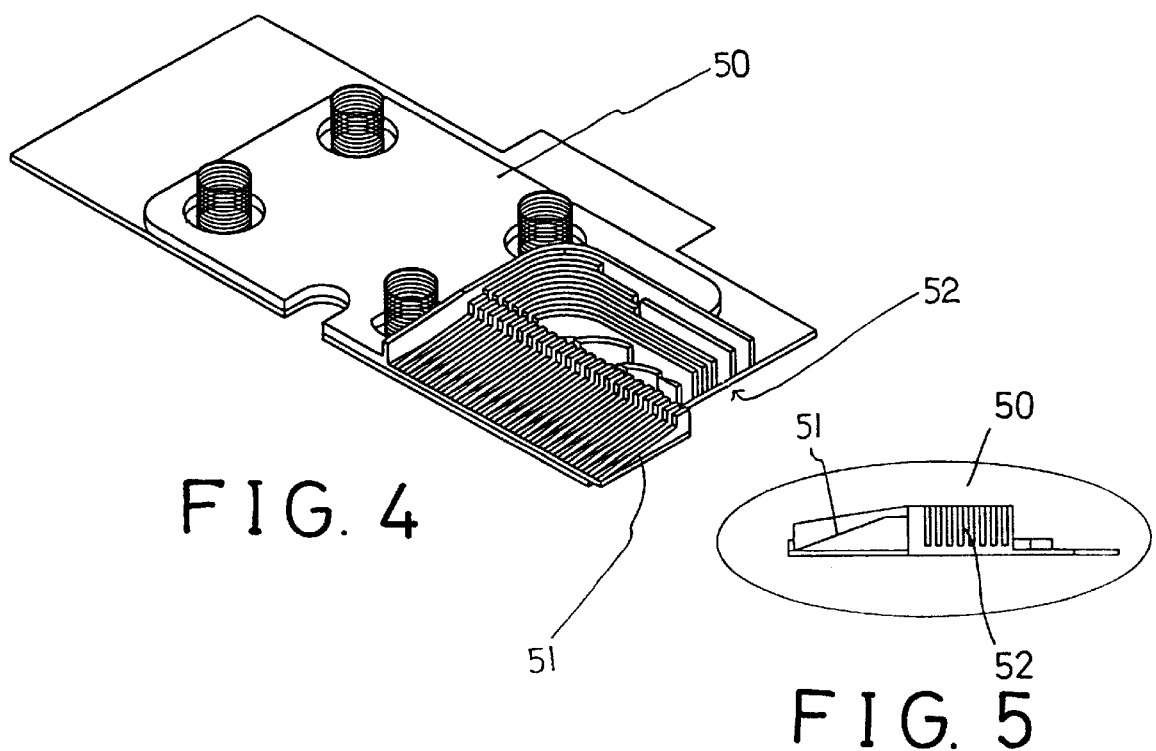
FIG. 4
FIG. 5

US 6,238,181 B1

HEAT DISSIPATING DEVICE FOR PORTABLE APPARATUS

BACKGROUND OF THE INVENTION

1. Field of the Invention

The present invention relates to a portable apparatus, and more particularly to a portable computer having a heat dissipating device.

2. Description of the Prior Art

Typical portable computers, or the so-called notebook computers, comprise a parallelepiped housing including a fan device disposed therein for circulating the air or for forcing the air into and out of the housing for heat dissipating purposes. The fan device is normally directed downward to the opening formed in the bottom of the housing. However, the bottom opening of the housing may be blocked when the portable computer is disposed on the legs of the users, such that the microprocessor of the portable computer may be damaged by heat.

The present invention has arisen to mitigate and/or obviate the afore-described disadvantages of the conventional portable computers.

SUMMARY OF THE INVENTION

The primary objective of the present invention is to provide a portable apparatus having a heat dissipating device for facilitating the heat dissipating effect of the portable apparatus.

In accordance with one aspect of the invention, there is provided a portable apparatus comprising a housing including an inclined board formed therein and for defining a cut-off opening therein, the inclined board including at least one aperture formed therein and communicating with the cut-off opening of the housing for preventing the aperture of the inclined board from being blocked, and a fan device secured to the inclined board for circulating air through the aperture of the inclined board and the cut-off opening of the housing.

The housing includes a bottom wall, the inclined board is inclined relative to the bottom wall of the housing. The inclined board includes a spider rib formed therein for forming the aperture therein. The housing includes a side wall having at least one orifice formed therein, and a heat dissipating plate secured in the housing and having a plurality of heat dissipating fins extended therefrom and arranged between the orifice of the side wall and the fan device for allowing the air to flow through the heat dissipating fins. A pad is further secured between the inclined board of the housing and the fan device.

The housing includes a bottom wall and a side wall and an end wall having a corner formed therebetween and having the cut-off opening formed in the corner, the portable apparatus further includes a stand attached to the corner of the housing. The stand includes an L-shaped body having a panel and a projection extended therefrom for engaging with the housing. The stand includes at least one cavity formed therein for allowing the air to flow therethrough.

Further objectives and advantages of the present invention will become apparent from a careful reading of a detailed description provided hereinbelow, with appropriate reference to accompanying drawings.

BRIEF DESCRIPTION OF THE DRAWINGS

FIG. 3 is a partial perspective view showing the air inlet of the housing;

FIG. 4 is a perspective view of a heat dissipating plate;

FIG. 5 is a plane view of the heat dissipating plate;

DETAILED DESCRIPTION OF THE PREFERRED EMBODIMENT

Figure 1:
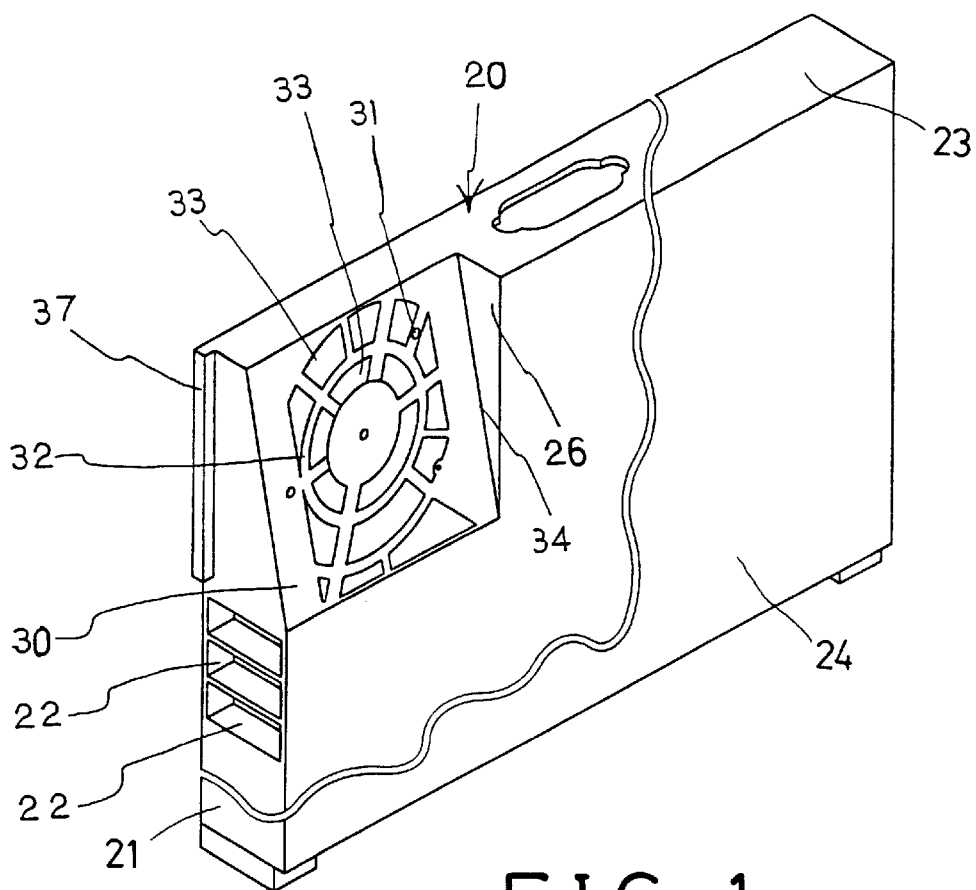
FIG. 1 is a perspective view of a housing of a portable apparatus in accordance with the present invention, in which the housing is erected.
Figure 2:
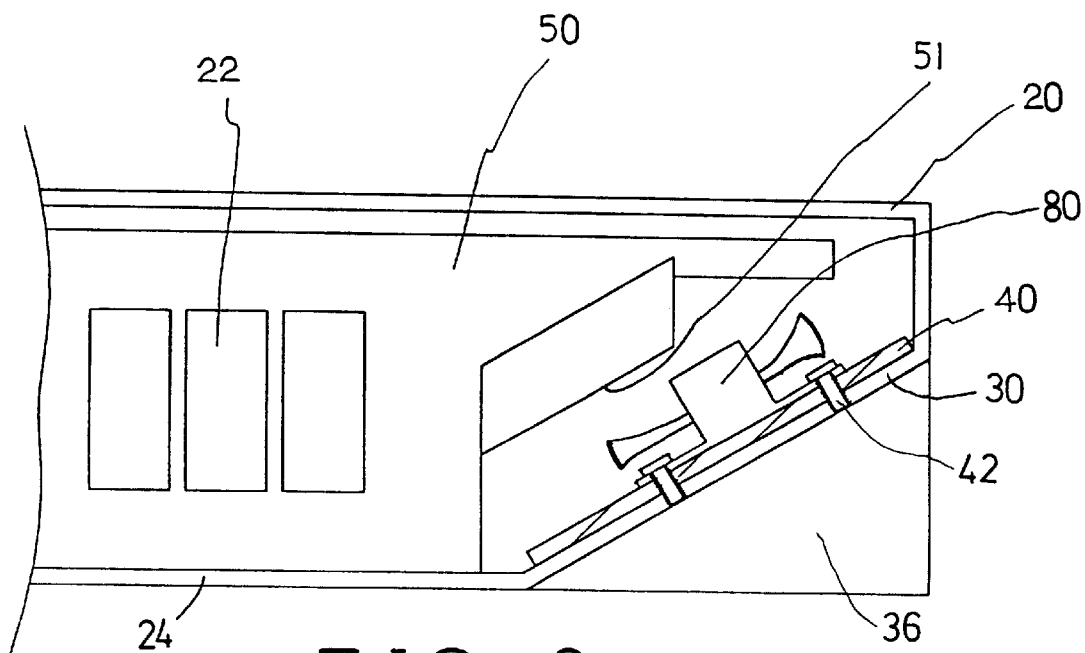
FIG. 2 is a partial cross sectional view of the housing, showing the location of the fan device.

Referring to the drawings, and initially to FIGS. 1–3, a portable apparatus in accordance with the present invention is particularly a portable computer or a notebook computer and comprises a housing 20 and/or a cover 88 (FIGS. 6, 7) pivotally coupled to the housing 20. The housing 20 includes one side wall 21 having one or more air outlets or orifices 22 formed therein, and includes an end wall 23, and includes a bottom wall 24, and includes an inclined board 30 formed in the corner formed between the side wall 21 and the end wall 23 and the bottom wall 24 and inclined relative to the bottom wall 24 for defining a cut-off opening 36 which is provided and formed as an air inlet to the housing 20. The inclined board 30 is inclined relative to the bottom wall 24 and includes a number of holes 31 formed therein for receiving fasteners 42 which may secure a fan device 80 and/or a pad 40 to the inclined board 30 (FIG. 2). The pad 40 is provided for cushioning purposes. The inclined board 30 includes a spider rib 32 for forming a number of apertures 33 which are communicating with the cut-off opening 36 of the housing 20 for allowing the air to be drawn into the housing 20. The housing 20 includes a fence 26 formed between the bottom wall 24 and the inner edge 34 of the inclined board 30. The housing 20 includes a flange 37 extended outward from the side wall 21 thereof.

Referring next to FIGS. 4 and 5, and again to FIG. 2, a heat dissipating plate 50 is secured to the processing unit of the portable computer (not shown) and is secured in the housing 20 and includes a number of tapered fins 51 and a number of heat dissipating fins 52 extended therefrom. The heat dissipating fins 52 are directed toward the air outlets 22 of the housing 20. The tapered fins 51 are directed toward the fan device 80 for receiving and directing the air that is generated by the fan device 80 through the heat dissipating fins 52 and for guiding the air to flow through the heat dissipating fins 52 before leaving the air outlets 22 of the housing 20.

Figure 6:
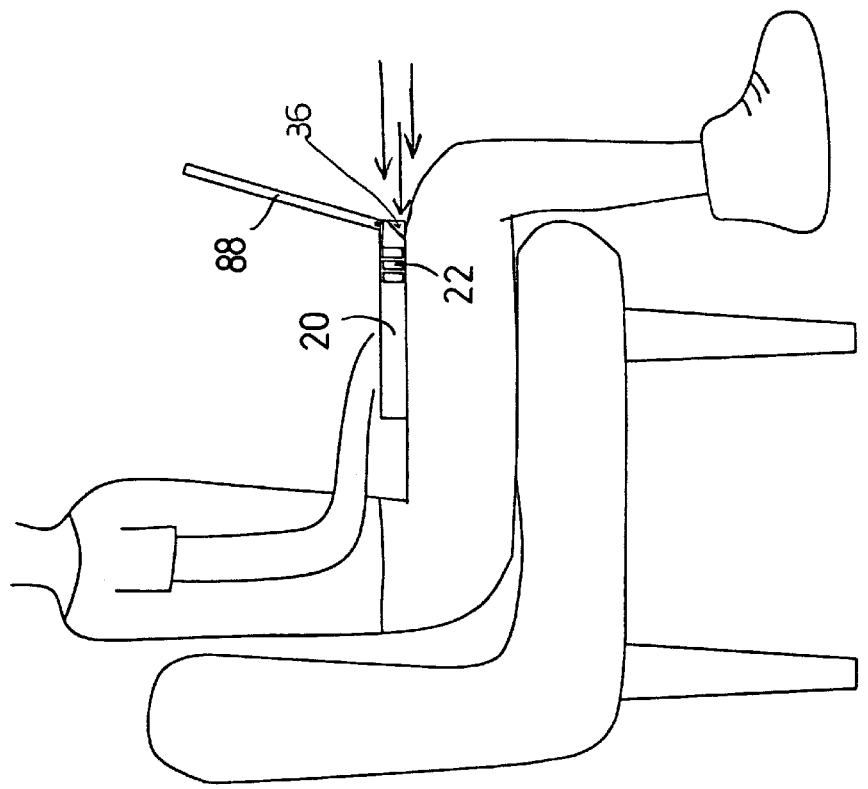
FIGS. 6 and 7 are plane views illustrating the operation of the portable apparatus.
Figure 7:
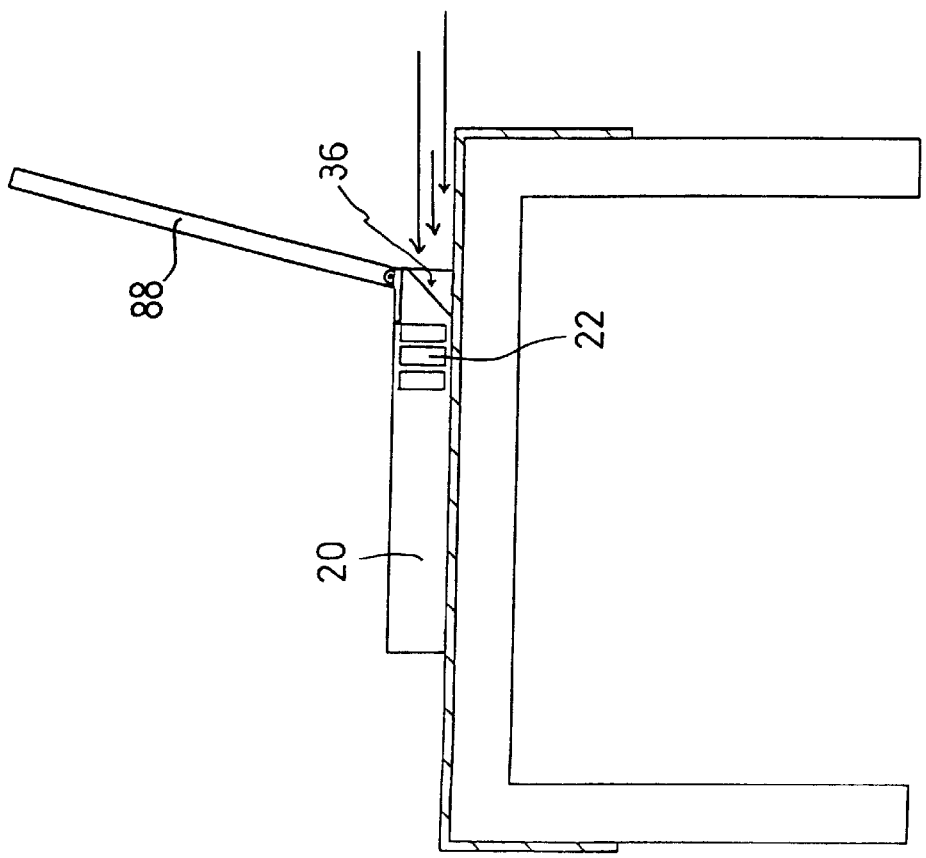

Referring next to FIGS. 6 and 7, when the housing 20 of the portable apparatus is disposed on the legs of the user (FIG. 6) or disposed on the table, the cut-off opening 36 of the housing 20 and the apertures 28 of the air inlets of the housing 20 will not be blocked such that the air may be effectively drawn into the housing 20. It is to be noted that the inclined board 30 is not necessarily to be formed in the corner of the housing 20, but may be formed in the other portion of the housing 20 where may also include the cut-off opening 36 formed therein for allowing the air to be drawn into the housing 20. Alternatively, the air may also be drawn into the housing 20 via the orifices 22 and may also flow out through the apertures 33 and the opening 36 of the housing 20.

Figure 9:
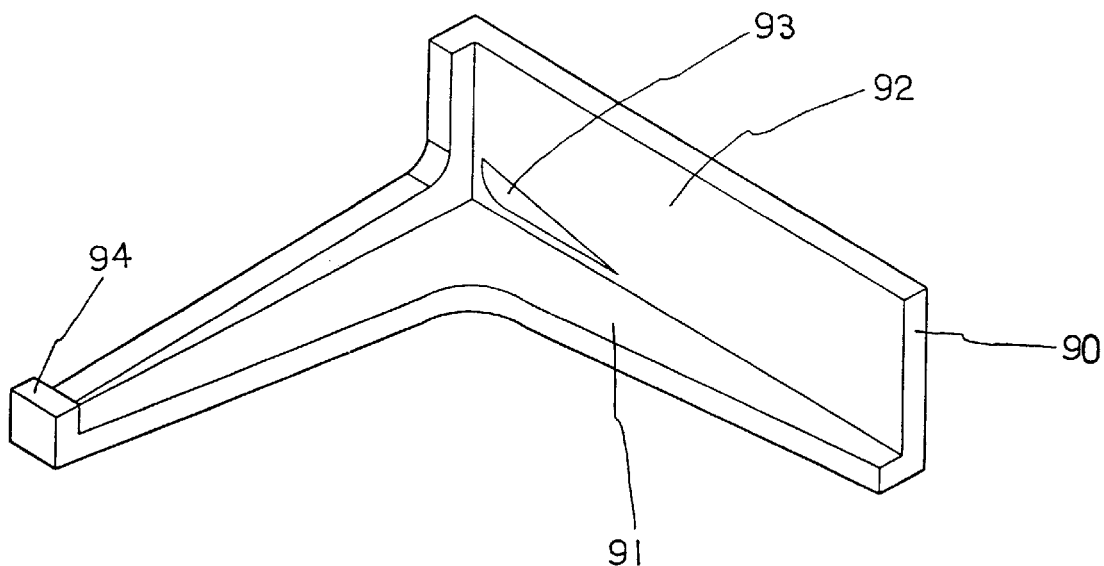
FIG. 9 is a perspective view of a stand for maintaining the cut-off opening or the air inlet of the housing.
Figure 8:
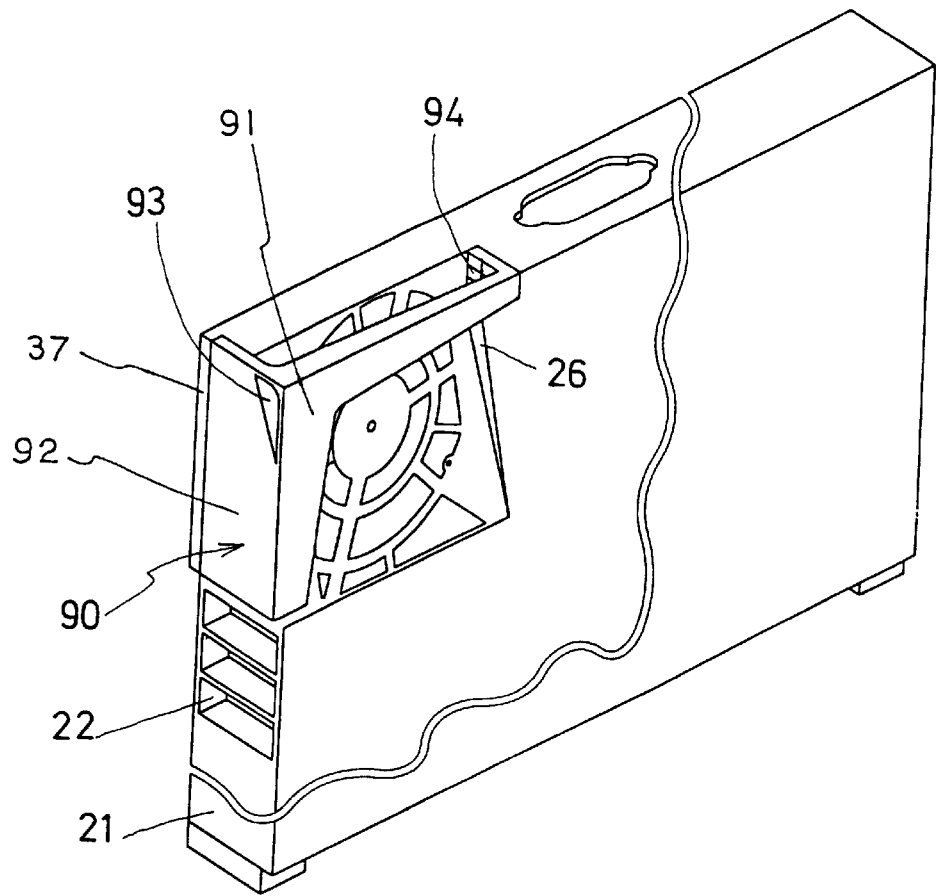
FIG. 8 is a perspective view illustrating the other application of the housing of the portable apparatus, in which the housing is erected.

Referring next to FIGS. 8 and 9, a stand 90 includes an L-shaped body 91 and includes a panel 92 extended from one limb of the stand body 91 for engaging with the flange 37 of the housing 20, and includes a projection 94 extended from the end portion of the other limb of the stand body 91 for engaging with the fence 26 of the housing 20. When the housing 20 and the stand 90 are disposed on a flexible sheet member, such as a paper sheet or a blanket or the like, the stand 90 may engage with the flexible sheet member and may retain the sheet member in place and may prevent the sheet member from being drawn to block the air inlets or the apertures 33 of the housing 20 such that the air may be effectively drawn into the housing 20 via the air inlets 33 and the cut-off opening 36 of the housing 20. The stand 90 may be secured to the housing 20 by fasteners or by welding processes, but preferably detachably secured to the housing with fasteners. The stand 90 may further include one or more cavities 93 formed therein for further facilitating the air circulating effect through the air inlets 33.

Accordingly, the portable apparatus in accordance with the present invention includes a heat dissipating device for facilitating the heat dissipating effect of the portable apparatus.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A portable apparatus comprising:

a housing including a bottom wall and a side wall and an end wall having a corner formed therebetween, and including an inclined board formed in said corner of said housing and formed between said bottom wall and said side wall and said end wall of said housing, and including a cut-off opening formed in said corner of said housing, said inclined board including at least one aperture formed therein and communicating with said cut-off opening of said housing for preventing said at least one aperture of said inclined board from being blocked, a fan device secured to said inclined board for circulating air through said at least one aperture of said inclined board and said cut-off opening of said housing, and a stand attached to said corner of said housing, said stand including an L-shaped body having a panel and a projection extended therefrom for engaging with said housing.

2. The portable apparatus according to claim 1, wherein said inclined board includes a spider rib formed therein for forming said at least one aperture therein.

3. The portable apparatus according to claim 1, wherein said said wall of said housing includes at least one orifice formed therein, and a heat dissipating plate secured in said housing and having a plurality of heat dissipating fins extended therefrom and arranged between said at least one orifice of said side wall and said fan device for allowing the air to flow through said heat dissipating fins.

4. The portable apparatus according to claim 1 further comprising a pad secured between said inclined board of said housing and said fan device.

* * * * *